United States Patent
Kuraoka et al.

(10) Patent No.: US 8,404,045 B2
(45) Date of Patent: Mar. 26, 2013

(54) METHOD FOR MANUFACTURING GROUP III NITRIDE SINGLE CRYSTALS

(75) Inventors: Yoshitaka Kuraoka, Anjo (JP); Shigeaki Sumiya, Handa (JP); Makoto Miyoshi, Inazawa (JP); Minoru Imaeda, Inchinomiya (JP)

(73) Assignee: NGK Insulators, Ltd., Nagoya (JP)

( * ) Notice: Subject to any disclaimer, the term of this patent is extended or adjusted under 35 U.S.C. 154(b) by 703 days.

(21) Appl. No.: 12/655,826

(22) Filed: Jan. 8, 2010

(65) Prior Publication Data
US 2010/0107969 A1   May 6, 2010

Related U.S. Application Data

(63) Continuation of application No. PCT/JP2008/062967, filed on Jul. 11, 2008.

(30) Foreign Application Priority Data

Jul. 13, 2007   (JP) .................................. 2007-184744

(51) Int. Cl.
*C30B 21/02*   (2006.01)
(52) U.S. Cl. ................ 117/90; 117/86; 117/94; 117/95; 117/105; 438/497
(58) Field of Classification Search ............ 117/86, 117/90, 94, 95, 105; 438/497
See application file for complete search history.

(56) References Cited

U.S. PATENT DOCUMENTS 6,306,675 B1 * 10/2001 Tsong et al. .................... 438/47
2004/0147096 A1 * 7/2004 Kitaoka et al. ................ 438/483

FOREIGN PATENT DOCUMENTS

| JP | 2000-108285 | * | 7/2000 |
| JP | 2000-327495 A1 | | 11/2000 |
| JP | 2004-247711 A1 | | 9/2004 |
| JP | 2005-001928 A1 | | 1/2005 |

OTHER PUBLICATIONS

M. Hao et al., "*Formation Chemistry of High-Density Nanocraters on the Surface of Sapphire Substrates with an* In Situ *Etching and Growth Mechanism of Device-Quality GaN Films on the Etched Substrates*," Applied Physics Letters, vol. 84, No. 20, May 17, 2004, pp. 4041-4043.
Fumio Kawamura et al., "*Growth of a Large GaN Single Crystal Using the Liquid Phase Epitaxy (LPE) Technique,*" Japanese Journal of Applied Physics, vol. 42, Part 2, No. 1A/B, Jan. 15, 2003, pp. L4-L6.

* cited by examiner

*Primary Examiner* — Bob M Kunemund
(74) *Attorney, Agent, or Firm* — Burr & Brown

(57) ABSTRACT

An underlying film 2 of a group III nitride is formed on a substrate 1 by vapor phase deposition. The substrate 1 and the underlying film 2 are subjected to heat treatment in the present of hydrogen to remove the underlying film 2 so that the surface of the substrate 1 is roughened. A seed crystal film 4 of a group III nitride single crystal is formed on a surface of a substrate 1A by vapor phase deposition. A group III nitride single crystal 5 is grown on the seed crystal film 4 by flux method.

14 Claims, 5 Drawing Sheets

(a)

(b)

(c)

(a)

(b)

METHOD FOR MANUFACTURING GROUP III NITRIDE SINGLE CRYSTALS

TECHNICAL FIELD OF THE INVENTION

The present invention relates to a method for growing a group III nitride single crystal.

BACKGROUND ART

Gallium nitride (GaN)-based thin film crystal draws attention as excellent blue light-emitting devices, has been used as a material for light-emitting diodes and expected as a blue-violet semiconductor laser device for an optical pickup. In recent years, the GaN thin film crystal draws attention as a semiconductor film composing an electronic device, such as a high-speed IC chip for use in cellular phones.

There is reported a method for depositing a seed crystal film of GaN or AlN on a single crystal substrate composed of sapphire to obtain a template substrate, and growing a GaN single crystal on the template substrate (see Japanese Patent Laid-open Publication No. 2000-327495A).

According to Formation chemistry of high-density nano-craters on the surface of sapphire substrates with an in-situ etching and growth mechanism of device-quality GaN films on the etched substrates" ("Applied Physics Letters", Volume 84, Number 20, pp. 4041 to 4043), after a GaN thin film is grown on a sapphire substrate, the GaN thin film and the sapphire substrate surface are in-situ etched by hydrogen annealing. This process makes it possible not only to almost eliminate the GaN thin film, but also to generate a number of minute microcraters on the sapphire substrate surface and to roughen the surface. When the GaN single crystal film is grown again on the sapphire substrate surface, voids are formed thereon. It is reported that the crystallinity of the GaN single crystal film can be remarkably improved according to the process.

Japanese Patent Laid-open Publication No. 2004-247711A discloses the following method. Voids are formed within a seed crystal substrate by ELO (Epitaxial Lateral Overgrowth) technique, and a c-plane GaN is grown over the substrate using melt containing an alkaline metal as represented by Na flux. As a result, the c-plane GaN and the sapphire substrate are separated from each other at the void region as their border, thereby obtaining a GaN single crystal self-standing substrate.

DISCLOSURE OF THE INVENTION

According to the method described in Japanese Patent Laid-open Publication No. 2000-327495A, for example, it is difficult to separate the GaN single crystal film from the underlying template substrate and to thereby produce the GaN single crystal self-standing substrate.

In the method described in "Applied Physics Letters", Volume 84, Number 20, pp. 4041 to 4043, the GaN thin film with excellent crystallinity can be obtained.

An object of the present invention is to provide a method for obtaining a self-standing substrate composed of high-quality group III nitride single crystal with high productivity.

The present invention provides a method comprising:
an underlying film forming step of forming an underlying film comprising a group III nitride on a substrate by vapor phase deposition;
an etching step of heating the substrate and the underlying film in the presence of hydrogen to remove the underlying film so that a surface of the substrate is roughened;
a seed crystal film formation step of forming a seed crystal film comprising a group III nitride single crystal on the surface of the substrate by vapor phase deposition; and
a crystal growth step of growing a group III nitride single crystal on the seed crystal film by a flux method.

The present inventors have formed the underlying film composed of the group III nitride on the substrate by vapor phase deposition, removed the underlying film therefrom and roughened the surface of the substrate by heating the substrate and the underlying film in the presence of hydrogen (in-situ etching). Subsequently, the inventors have formed the seed crystal film composed of the group III nitride single crystal on the surface of the substrate by vapor phase deposition. Thereafter, the inventors have proved that, when the group III nitride single crystal is grown on the seed crystal film by the flux method, single crystals having excellent crystallinity and a low dislocation density can be obtained with high productivity.

Further, the inventors have found that, after the group III nitride single crystal is formed by the flux method, the group III nitride can be easily or naturally separated from the substrate surface and the self-standing substrate composed of the group III nitride single crystal can be obtained. Since a stress due to warpage is eliminated during the separation, occurrence of cracks or damages can be suppressed as the temperature is lowered. Since the group III nitride is naturally separated from the substrate, the need for a separation step such as polishing the sapphire substrate or irradiation of a pulse laser can be eliminated. In addition to this, thermal and mechanical damages on the single-crystal self-standing substrate can be eliminated.

In addition, according to "Applied Physics Letters", Volume 84, Number 20, pp. 4041 to 4043, the c-plane GaN single crystal film is formed by MOCVD on the sapphire substrate surface subjected to hydrogen annealing and crystallinity of the single crystal film is evaluated. The separation of the single crystal film from the substrate surface is not reported. Accordingly, when the group III nitride film is formed on the substrate surface by the flux method, the natural separation of the group III nitride film from the substrate surface has been beyond the expectation of "Applied Physics Letters", Volume 84, Number 20, pp. 4041 to 4043.

BEST MODES FOR CARRYING OUT THE INVENTION

Figure 1:
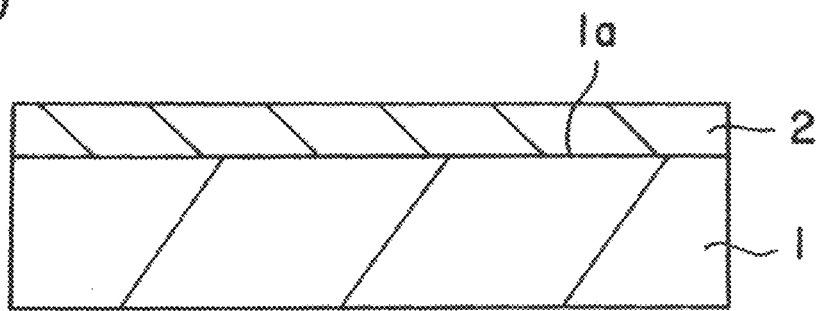
FIG. 1(a) is a cross-sectional view schematically illustrating a state of forming an underlying film 2 on a substrate 1.
FIG. 1(b) is a cross-sectional view schematically illustrating a substrate 1A after in-situ etching of the substrate 1.
FIG. 1(c) is a cross-sectional view schematically illustrating a state of forming a seed crystal film 4 on a roughened surface 3 of the substrate 1A.
Figure 1:
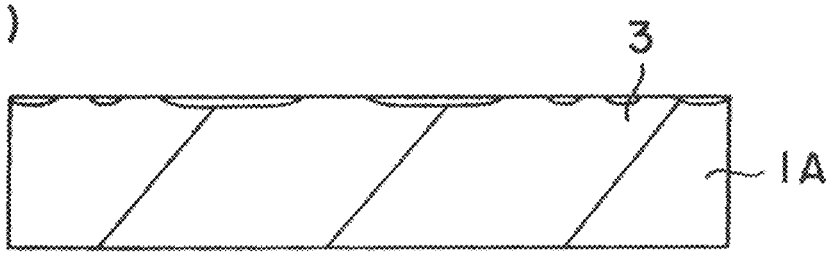
Figure 1:
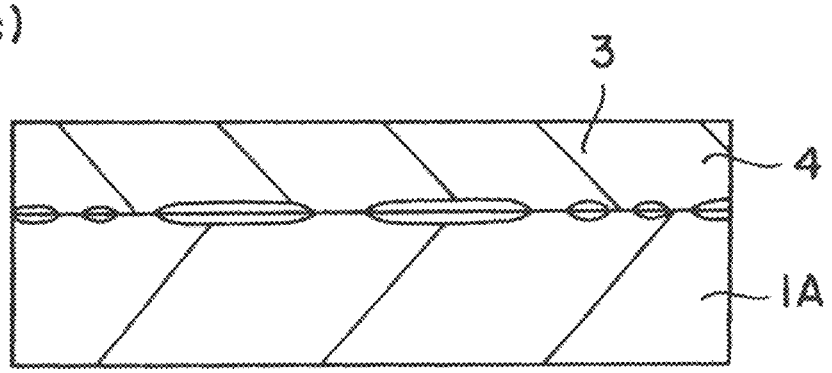

The present invention will be described in detail below, with reference to the accompanying drawings.

As illustrated in FIG. 1(a), an underlying film 2 composed of a group III nitride is formed on a surface 1a of a substrate 1. Next, by heating the substrate and the underlying film in the presence of hydrogen, the underlying film 2 is almost etched and removed, and a number of minute craters are generated over a surface of a substrate 1A to thereby form a roughened surface 3, as illustrated in FIG. 1(b). Then, as shown in FIG. 1(c), a seed crystal film 4 composed of a group III nitride single crystal is formed on a surface 3 of the substrate 1A. Within this seed crystal film 4, dislocation is suppressed by the influence of the roughened surface 3, thereby obtaining a seed crystal with excellent crystallinity.

Next, as shown in FIG. 2(a), a group III nitride single crystal 5 is epitaxially grown on the seed crystal film 4 by a flux method. In this state, as the group III nitride single crystal 5 becomes thicker, the single crystal 5 tends to be easily and naturally separated along a surface of the substrate 1A. Accordingly, as illustrated in FIG. 2(b), the seed crystal film 4 and the single crystal 5 can be easily separated along the roughened surface 3 of the substrate 1A, resulting in a self-standing substrate.

According to the present invention, the kind of the substrate is not particularly limited, as long as the group III nitride can be grown. Examples of such a material include sapphire, silicon single crystal, SiC single crystal, MgO single crystal, spinel ($MgAl_2O_4$), $LiAlO_2$, $LiGaO_2$, and perovskite composite oxides such as $LaAlO_3$, $LaGaO_3$ and $NdGaO_3$. Also, it is possible to use cubic perovskite structure composite oxides represented by the composition formula $[A_{1-y}(Sr_{1-x}Ba_x)_y][(Al_{1-z}Ga_z)_{1-u}D_u]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2). In addition, SCAM ($ScAlMgO_4$) may be also used.

In the present invention, the underlying film and the seed crystal film are formed by the group III nitride, and further the group III nitride is grown by the flux method. Three kinds of these group III nitrides are preferably the same with each other; but as far as the epitaxial growth is possible, they may be different from each other.

Wurtzite structure of each group III nitride has c-plane, a-plane and m-plane Each of these crystal faces is crystallographically defined. Growing directions of the underlying film, the seed crystal film and the group III nitride single crystal grown by the flux method may be the directions normal to the c-plane, the a-plane and the m-plane, respectively.

Each of these group III nitrides is preferably one or more metal nitrides selected from the group of Ga, Al, and In; and GaN, AlN, GaAlN and GaAlInN may be particularly preferably used. Further, these nitrides may contain an unintended impurity element. For the purpose of controlling electrical conductivity, the nitrides may contain dopant elements such as intentionally added Si, Ge, Be, Fe, Mg, Zn and Cd.

A formation method of the underlying film is vapor phase deposition, and examples of such a method include Metal Organic Chemical Vapor Deposition (MOCVD), Hydride Vapor Phase Epitaxy (HVPE), Molecular Beam Epitaxy (MBE) and sublimation.

A thickness of the underlying film is not particularly limited. However, for the purpose of exerting the effect of the subsequent in-situ etching, the underlying film having a thickness of 0.01 μm or more may preferably be used, so that the etching effect of the substrate surface starts to be obtained. The underlying film having a thickness of 0.1 μm or more is more preferable. If it is too thick, it takes a long time to etch the substrate surface, resulting in not only a poor efficiency, but also too large irregularities of the surface due to the etching. Accordingly, it is difficult to form the voids during the growth in the lateral direction during the formation of the seed crystal film. Therefore, the underlying film having a thickness of 3.0 μm or less may be preferably used and the underlying film having a thickness of 15 μm or less may be more preferably used.

The in-situ etching is performed under the condition that etching of the underlying film and the substrate surface is possible. Specifically, hydrogen is present in an atmosphere and heat treatment is performed. Any other gas except hydrogen may be or may not be contained in the atmosphere. When any other gas except hydrogen is contained in the atmosphere, the gas is preferably nitrogen, argon, helium or the like.

A temperature during the in-situ etching is preferably 1000° C. or more. Meanwhile, when the temperature is too high, a harmful influence is exerted on crystallinity or warpage of the substrate, and therefore, a temperature of 1300° C. or less is preferable.

In the present invention, a method for forming the seed crystal film is the vapor phase deposition, and examples of such a method include Metal Organic Chemical Vapor Deposition (MOCVD), Hydride Vapor Phase Epitaxy (HVPE), Molecular Beam Epitaxy (MBE) and sublimation.

In the present invention, the group III nitride single crystal is grown by the flux method. On this occasion, as long as the group III nitride single crystal can be generated, a type of the flux is not particularly limited. In a preferred embodiment, the flux containing at least one of an alkaline metal and an alkaline-earth metal is used, and the flux containing sodium metal may be particularly preferably used.

As to the flux, raw materials of the group III nitride single crystal to be desired are mixed and used. The raw materials composing the flux are selected in accordance with the group III nitride single crystal to be desired.

As such gallium raw materials, for example, gallium single metal, a gallium alloy or a gallium compound may be used; in terms of handling, gallium single metal may be used preferably. As such aluminum raw materials, aluminum single metal, an aluminum alloy or an aluminum compound may be used; in terms of handling, aluminum single metal may be used preferably. As such indium raw materials, indium single metal, an indium alloy or an indium compound may be used; in terms of handling, indium single metal may be used preferably.

The growth temperature of the group III nitride single crystal in the flux method and the holding time during the growth are not particularly limited, and they are appropriately changed in accordance with a type of the single crystal to be desired or a composition of the flux. As an example, when the GaN single crystal is grown using a flux containing sodium or lithium, the growth temperature may be set to 800° C. to 1000° C.

By the flux method, a single crystal is grown in an atmosphere of nitrogen-containing gas. For this gas, nitrogen gas may be preferably used, and ammonia may be used. The total pressure of the atmosphere is not particularly limited; but it may be preferably set to 10 atm or more, and further preferably 30 atm or more, from the standpoint of prevention against the evaporation of the flux. However, as the pressure is high, an apparatus becomes large. Therefore, the total pressure of the atmosphere may be preferably set to 2000 atm or less, and further preferably 500 atm or less. Any other gas except the nitrogen-containing gas in the atmosphere is not limited; but an inert gas may be preferably used, and argon, helium, or neon may be particularly preferably used.

EXAMPLES

Example 1

Figure 2:
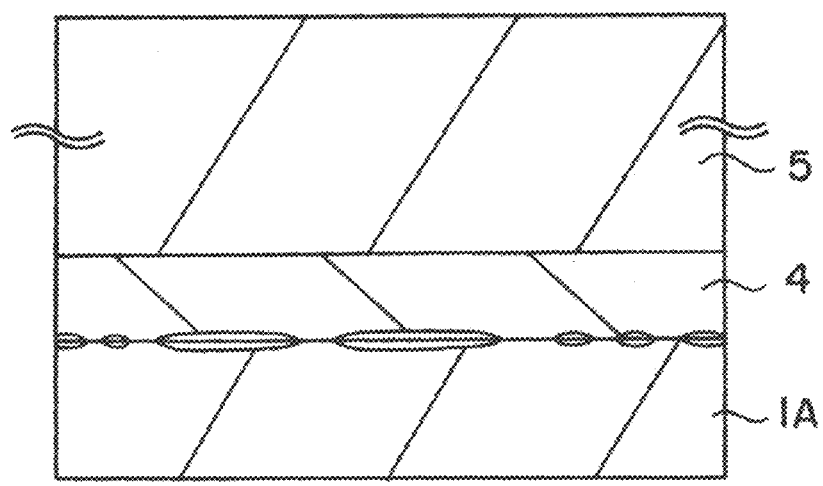
FIG. 2(a) is a cross-sectional view schematically illustrating a state of forming a group III nitride single crystal 5 on the seed crystal film 4.
FIG. 2(b) is a cross-sectional view schematically illustrating a state of separating the single crystal 5 from the substrate.
Figure 2:
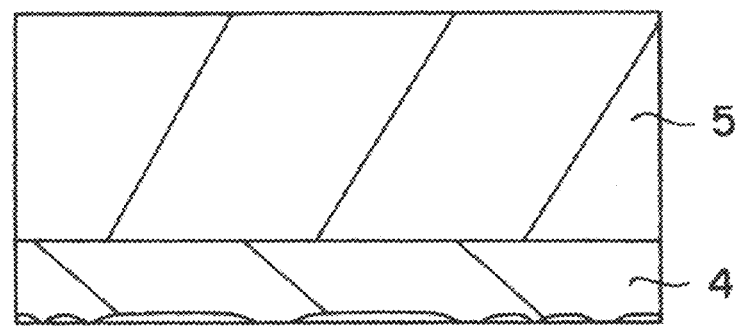
Figure 2:
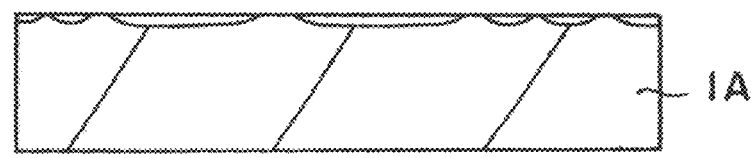

A c-plane GaN single crystal self-standing substrate was manufactured using the method described with reference to FIGS. 1 and 2.
(Manufacture of Underlying Film)

A c-plane sapphire substrate 1 with a diameter of 2 inches was put in an MOCVD furnace (metal organic chemical vapor deposition furnace), and heated at 1150° C. for 10 minutes in hydrogen atmosphere to perform the cleaning of the substrate surface. Then, the substrate temperature was reduced to 500° C., and the GaN film was grown to a thickness of 0.03 μm using TMG (trimethyl gallium) and ammonia as raw materials. Next, the substrate temperature was raised up to 1100° C., and the GaN single crystal underlying film 2 was grown to a thickness of 0.5 μm using TMG (trimethyl gallium) and ammonia as raw materials.
(In-situ Etching)

This substrate was heated again at 1150° C. for 15 minutes in hydrogen atmosphere, and the surface GaN film 2 was almost evaporated to expose the sapphire substrate 1A. It was confirmed that at this time, the surface of the sapphire substrate 1A was etched and evaporated along with the GaN, and minute irregularities were generated.
(Formation of Seed Crystal Film)

Using TMG and ammonia as raw materials as well as hydrogen gas and nitrogen gas as a carrier gas again, the GaN seed crystal film 4 was grown again on the substrate at a temperature of 1100° C. and deposited to a thickness of 5 μm. As a result of measuring the defect density of the thus obtained seed crystal film 4, it was proved to be about $10^8$ defects/cm².
(Flux Method)

Using this substrate as a seed substrate, the c-plane GaN single crystal 5 was grown by Na flux method. Raw materials used for the growth are gallium metal, sodium metal and lithium metal. 45 g of gallium metal, 66 g of sodium metal and 45 mg of lithium metal were filled in an alumina crucible, respectively, and the GaN single crystal was grown for about 100 hours at an in-furnace temperature of 900° C. and at a pressure of 50 atm. As a result of taking out the GaN single crystal from the crucible, the transparent single crystal was grown and GaN was deposited over the substrate surface to a thickness of about 1 mm.

The sapphire substrate and the GaN single crystal were naturally separated from each other during the cooling, and occurrence of cracks was not also observed. The sapphire substrate and the GaN single crystal were separated from each other by the minute irregularities formed over the sapphire substrate surface due to a thermal expansion difference between the sapphire and GaN. As a result of repeating the same step ten times, the same result was observed all ten times.
(Evaluation of Crystallinity)

The thus obtained c-plane GaN single crystal self-standing substrate was polished using diamond abrasive to form a flat surface, thereby obtaining the GaN single crystal self-standing substrate with a diameter of 2 inches. As a result of measuring the defect density of this GaN single crystal substrate, it is extremely low at $10^5$ defects/cm² or less. A half band width obtained by ω scan at a (0002)-plane measured by XRD (X-ray Diffraction Technique) was 20 seconds.

Example 2

An a-plane GaN single crystal self-standing substrate was manufactured using the method described with reference to FIGS. 1 and 2.
(Manufacture of Underlying Film)

An r-plane sapphire substrate 1 with a diameter of 2 inches was put in an MOCVD furnace (metal organic chemical vapor deposition furnace), and heated at 1150° C. for 10 minutes in hydrogen atmosphere to perform the cleaning of the substrate surface. Next, the substrate temperature was reduced to 500° C., and a GaN film was grown to a thickness of 0.03 μm using TMG (trimethyl gallium) and ammonia as raw materials. Next, the substrate temperature was raised up to 1100° C., and the GaN single crystal underlying film 2 was grown to a thickness of 0.5 μm using TMG (trimethyl gallium) and ammonia as raw materials.
(In-Situ Etching)

This substrate was heated again at 1150° C. for 30 minutes in hydrogen atmosphere, and the surface GaN film 2 was almost evaporated to expose the sapphire substrate 1A. It was confirmed that at this time, the surface of the sapphire substrate was etched and evaporated along with the GaN, and minute irregularities were generated.
(Formation of Seed Crystal Film)

Using TMG and ammonia as raw materials as well as hydrogen gas and nitrogen gas as a carrier gas again within the same furnace, the GaN seed crystal film 4 was grown again over the sapphire substrate 1A at a temperature of 1100° C. and deposited to a thickness of 5 μm. As a result of measuring the defect density of the thus obtained seed crystal film 4, it was proved to be about $10^8$ defects/cm².
(Flux Method)

Using this substrate as a seed substrate, the GaN crystal 5 was grown by Na flux method. Raw materials used for the growth are gallium metal, sodium metal and lithium metal. 45 g of gallium metal, 66 g of sodium metal and 45 mg of lithium metal were filled in an alumina crucible, respectively, and the GaN crystal was grown for about 100 hours at an in-furnace temperature of 900° C. and at a pressure of 50 atm. As a result of taking out the GaN crystal from the crucible, the transparent single crystal was grown and the a-plane GaN single crystal 5 was deposited on the substrate surface to a thickness of about 1 mm The sapphire substrate 1A and the GaN seed crystal film 4 were naturally separated from each other during the cooling, and occurrence of cracks was not also observed. The sapphire substrate 1A and the GaN seed crystal film 4 were separated from each other by the minute irregularities formed on the sapphire substrate surface due to a thermal expansion difference between the sapphire and GaN. As a result of repeating the same step ten times, the same result was observed all ten times
(Evaluation of Crystallinity)

The thus obtained a-plane GaN single crystal self-standing substrate was polished using diamond abrasive to form a flat surface, thereby obtaining the a-plane GaN single crystal self-standing substrate with a diameter of 2 inches. As a result of measuring the defect density of this a-plane GaN single crystal self-standing substrate, it was proved to be about $10^6$ defects/cm² or less all ten times. A half band width obtained by ω scan at a (11-20-plane measured by an X-ray rocking curve (XRC) was 50 seconds.

Example 3

An m-plane GaN single crystal self-standing substrate was manufactured using the method according to the present invention described with reference to FIGS. 1 and 2.

(Manufacture of Underlying Film)

An m-plane sapphire substrate 1 with a diameter of 2 inches was put in an MOCVD furnace (metal organic chemical vapor deposition furnace), and heated at 1150° C. for 10 minutes in hydrogen atmosphere to perform the cleaning of a substrate surface. Next, the substrate temperature was reduced to 500° C., and the GaN film was grown to a thickness of 0.03 μm using TMG (trimethyl gallium) and ammonia as raw materials. Next, the substrate temperature was raised up to 1100° C., and the GaN single crystal underlying film 2 was grown to a thickness of 0.5 μm using TMG (trimethyl gallium) and ammonia as raw materials.

(In-Situ Etching)

This substrate was heated again at 1150° C. for 30 minutes in hydrogen atmosphere, and the surface GaN film 2 was almost evaporated to expose the sapphire substrate 1A. It was confirmed that at this time, the surface of the sapphire substrate 1A was etched and evaporated along with the GaN, and minute irregularities were generated (Formation of Seed Crystal Film)

Using TMG and ammonia as raw materials as well as hydrogen gas and nitrogen gas as a carrier gas again within the same furnace, the seed crystal film 4 composed of the m-plane GaN single crystal was grown again over the substrate 1A at a temperature of 1100° C. and deposited to a thickness of 5 μm. As a result of measuring the defect density of the thus obtained seed crystal film 4, it was proved to be about $10^8$ defects/$cm^2$.

(Flux Method)

Using this substrate as a seed substrate, the m-plane GaN single crystal 5 was grown by Na flux method. Raw materials used for the growth are gallium metal, sodium metal and lithium metal. 45 g of gallium metal, 66 g of sodium metal and 45 mg of lithium metal were filled in an alumina crucible, respectively, and the GaN single crystal was grown for about 100 hours at an in-furnace temperature of 900° C. and at a pressure of 50 atm. As a result of taking out the GaN single crystal from the crucible, the transparent single crystal was grown and the GaN was deposited on the substrate surface to a thickness of about 1 mm. The sapphire substrate 1A and the GaN single crystal 5 were naturally separated from each other during the cooling, and occurrence of cracks was not also observed. The sapphire substrate 1A and the GaN single crystal 5 were separated from each other by the minute irregularities formed over the sapphire substrate surface due to a thermal expansion difference between the sapphire and GaN. As a result of repeating the same step ten times, the same result was observed all ten times (Evaluation of Crystallinity)

The thus obtained GaN self-standing substrate was polished using diamond abrasive to form a flat surface, thereby obtaining the m-plane GaN single crystal self-standing substrate with a diameter of 2 inches. As a result of measuring the defect density of this GaN single crystal substrate, it was proved to be about $10^6$ defects/$cm^2$ or less all ten times. A half band width obtained by ω scan at a (1-100)-plane measured by an X-ray rocking curve (XRC) was 50 seconds.

Example 4

A c-plane GaN single crystal self-standing substrate was manufactured using the method described with reference to FIGS. 1 and 2.

(Substrate Cleaning)

A c-plane sapphire substrate 1 with a diameter of 2 inches was put in an MOCVD furnace (metal organic chemical vapor deposition furnace), and heated at 1150° C. for 10 minutes in hydrogen atmosphere to perform the cleaning of a substrate surface.

(Manufacture of Underlying Film)

Next, the substrate temperature was reduced to 500° C., and the GaN film was grown to a thickness of 0.03 μm using TMG (trimethyl gallium) and ammonia as raw materials. Next, the substrate temperature was raised up to 1100° C., and the GaN underlying film 2 was grown to a thickness of 0.5 μm using TMG (trimethyl gallium) and ammonia as raw materials.

(In-Situ Etching)

This substrate was heated again at 1100° C. for 15 minutes in hydrogen atmosphere, and the surface GaN film 2 was almost evaporated to expose the sapphire substrate 1A. It was confirmed that at this time, the surface of the sapphire substrate 1A was etched and evaporated along with the GaN, and minute irregularities were generated.

The above-described underlying film formation step and in-situ etching step were repeatedly performed once, twice and four times (set to the conditions A, B and C, respectively).

(Formation of Seed Crystal Film)

Using TMG and ammonia as raw materials as well as hydrogen gas and nitrogen gas as a carrier gas again, the GaN seed crystal film 4 was grown again on the sapphire substrate 1A at a temperature of 1100° C. and deposited to a thickness of 5 μm. Surface morphologies of the seed crystal film 4, cross-sectional SEM images in the vicinity of interface between the sapphire substrate and the seed crystal film (GaN), area ratios occupied by the voids in the interface within the substrate (void rate), and defect densities obtained using the conditions A, B and C were measured. The results of the void rate and the defect density are as follows.

Condition A:
Void rate: 15%, Defect density (average): $1.4 \times 10^9$ defects/$cm^2$ Condition B:
Void rate: 30%, Defect density (average): $8.2 \times 10^8$ defects/$cm^2$ Condition C:
Void rate: 45%, Defect density (average): $2.5 \times 10^8$ defects/$cm^2$ (Flux Method)

Using these substrates as a seed substrate, the c-plane GaN single crystal 5 was grown by Na flux method. Raw materials used for the growth are gallium metal, sodium metal and lithium metal. 45 g of gallium metal, 66 g of sodium metal and 45 mg of lithium metal were filled in an alumina crucible, respectively, and the GaN single crystal was grown for about 100 hours at an in-furnace temperature of 900° C. and at a pressure of 50 atm. As a result of taking out the GaN single crystal from the crucible, the transparent single crystal was grown and the GaN was deposited on the substrate surface to a thickness of about 1 mm.

Figure 3:
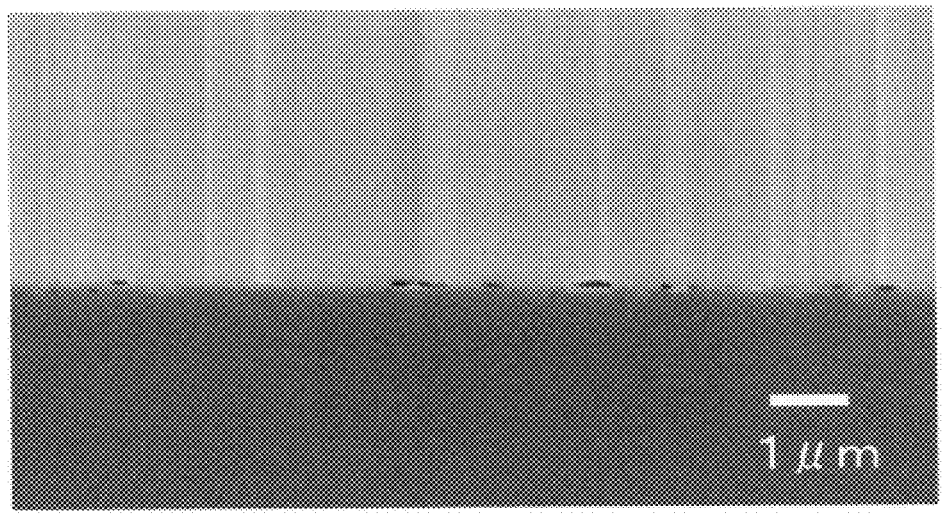
FIG. 3 is an enlarged photograph illustrating an interface vicinity between a sapphire substrate and GaN single crystal film obtained under the condition "A".
Figure 4:
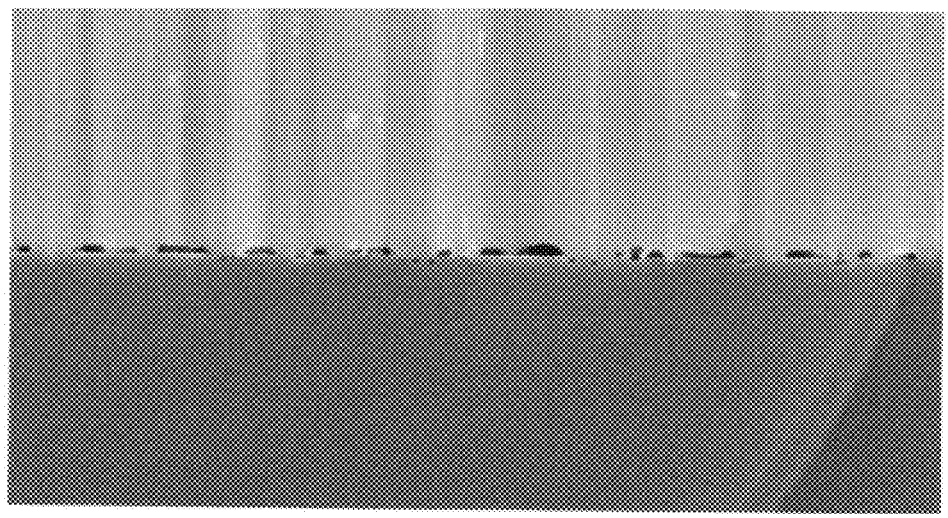
FIG. 4 is an enlarged photograph illustrating an interface vicinity between a sapphire substrate and GaN single crystal film obtained under the condition "B".
Figure 5:
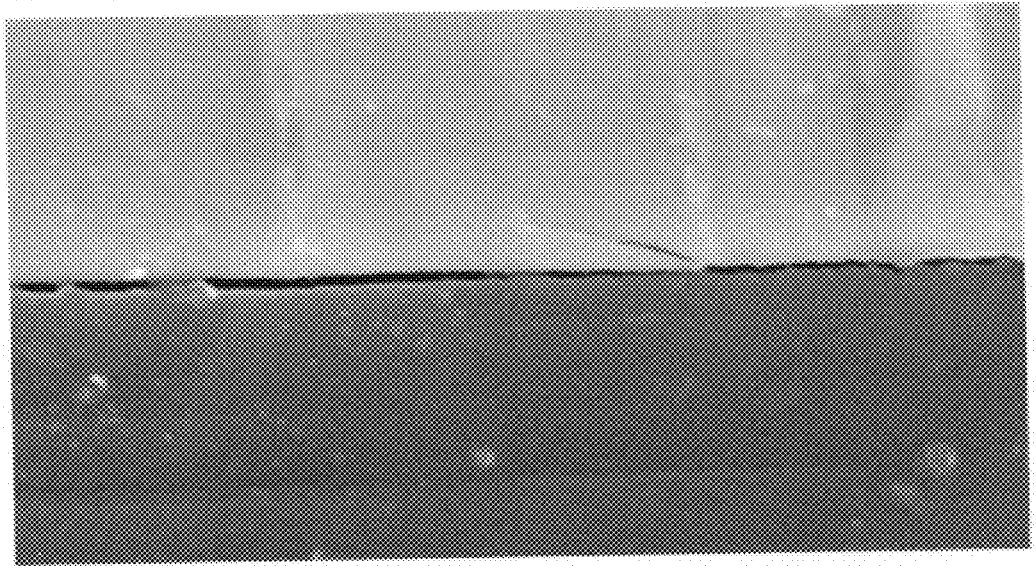
FIG. 5 is an enlarged photograph illustrating an interface vicinity between a sapphire substrate and GaN single crystal film obtained under the condition "C".

FIG. 3 is an enlarged photograph illustrating the interface vicinity between the sapphire substrate and the GaN single crystal film obtained under the condition A. FIG. 4 is an enlarged photograph illustrating the interface vicinity between the sapphire substrate and the GaN single crystal film obtained under the condition B. FIG. 5 is an enlarged photograph illustrating the interface vicinity between the sapphire substrate and the GaN single crystal film obtained under the condition C.

In general, the sapphire substrate and the GaN single crystal were naturally separated from each other during the cooling, and occurrence of cracks was not also observed. The sapphire substrate and the GaN single crystal were separated from each other by the minute irregularities formed on the sapphire substrate surface due to a thermal expansion difference between the sapphire and GaN. In particular, as shown in FIGS. 4 and 5, the underlying film formation step and the etching step are repeated, whereby the voids generated in the interface between the sapphire substrate and the GaN single crystal film become large.

As a result of repeating the same step ten times, the separations of six times under the condition A, those of nine times under the condition B, and those of ten times under the condition C were confirmed. In the substrate that is not separated, cracks were caused by the stress due to the thermal expansion difference.

(Evaluation of Crystallinity)

The c-plane GaN single crystal self-standing substrate with the separation confirmed was polished using diamond abrasive to form a flat surface, thereby obtaining the GaN single crystal self-standing substrate with a diameter of 2 inches. As a result of measuring the defect densities of the GaN single crystal substrates under the conditions A, B and C, they were extremely low at $1.8 \times 10^3$, $1.8 \times 10^3$, and $1.5 \times 10^3$ (defects/$cm^2$) on the average, respectively. A half band width obtained of ω scan at a (0002)-plane measured by an X-ray rocking curve (XRC) was about 20 seconds.

Comparative Example

Manufacture of Underlying Film

The c-plane sapphire substrate 1 with a diameter of 2 inches was put in an MOCVD furnace (metal organic chemical vapor deposition furnace), and heated at 1150° C. for 10 minutes in hydrogen atmosphere to perform the cleaning of a substrate surface. Next, the substrate temperature was reduced to 500° C., and the GaN film was grown to a thickness of 0.03 μm using TMG (trimethyl gallium) and ammonia as raw materials. Next, the substrate temperature was raised up to 1100° C., and the c-plane GaN single crystal underlying film 2 was grown to a thickness of 5 μm using TMG (trimethyl gallium) and ammonia as raw materials. As a result of measuring the defect density of the thus obtained multilayer seed substrate, it was proved to be about $1 \times 10^{10}$ defects/$cm^2$.

(Flux Method)

Using this substrate as a seed substrate, the GaN crystal was grown by Na flux method. Raw materials used for the growth are gallium metal, sodium metal and lithium metal. 45 g of gallium metal, 66 g of sodium metal and 45 mg of lithium metal were filled in an alumina crucible, respectively, and the GaN single crystal was grown for about 100 hours at an in-furnace temperature of 900° C. and at a pressure of 50 atm. As a result of taking out the GaN single crystal from the crucible, the transparent single crystal was grown and the GaN was deposited on the substrate surface to a thickness of about 1 mm.

(Substrate Separation)

As a result of repeating the same step ten times for the respective substrates, the sapphire substrate was attached firmly to the GaN layer in all ten times and a number of cracks and breakage occurred eight times. It is considered that the substrate warps due to a thermal expansion coefficient difference between the sapphire and GaN in the cooling step, and cracks and breakage occur by the stress. As to two substrates without the cracks and breakage, the sapphire substrate 1 was polished and removed using diamond abrasive coating. As a result, cracks and breakage were observed after the polishing in the GaN layers 5 in both the substrates, and therefore, even one non-defective substrate was not obtained.

(Evaluation of Crystallinity)

As a result of measuring the defect density of the divided GaN single crystal substrates, it was on the order of $4 \times 10^6$ defects/$cm^2$ on the average of the two substrates. A half band width obtained by ω scan at a (0002)-plane measured by an X-ray rocking curve (XRC) was 60 seconds.

Although the present invention has been described with reference to particular embodiments, the invention is not limited thereto and various changes and modification may be made without departing from the scope of the appended claims.

The invention claimed is:

1. A method of manufacturing a group III nitride single crystal, the method comprising:
   an underlying film formation step of forming an underlying film comprising a group III nitride on a substrate by vapor phase deposition;
   an etching step of heating the substrate and the underlying film in the presence of hydrogen to remove the underlying film so that a surface of the substrate is roughened;
   a seed crystal film formation step of forming a seed crystal film comprising a group III nitride single crystal on the surface of the substrate by vapor phase deposition; and
   a single crystal growth step of growing a group III nitride single crystal on the seed crystal film by a flux method.

2. The method of claim 1, wherein voids are formed between the substrate and the seed crystal film during the seed crystal film formation step.

3. The method of claim 1, wherein the group III nitride comprising one or more nitride of a metal selected from the group consisting of gallium, aluminum and indium.

4. The method of claim 1, wherein the group III nitride single crystal grown by the flux method is separated from the substrate to obtain a self-standing substrate.

5. The method of claim 3, wherein flux melt used in the flux method comprises sodium and wherein the group III nitride single crystal comprises gallium nitride.

6. The method of claim 1, wherein the underlying film formation step and the etching step are alternately performed more than once.

7. The method of claim 2, wherein the group III nitride comprising one or more nitride of a metal selected from the group consisting of gallium, aluminum and indium.

8. The method of claim 2, wherein the group III nitride single crystal grown by the flux method is separated from the substrate to obtain a self-standing substrate.

9. The method of claim 3, wherein the group III nitride single crystal grown by the flux method is separated from the substrate to obtain a self-standing substrate.

10. The method of claim 4, wherein flux melt used in the flux method comprises sodium and wherein the group III nitride single crystal comprises gallium nitride.

11. The method of claim 2, wherein the underlying film formation step and the etching step are alternately performed more than once.

12. The method of claim 3, wherein the underlying film formation step and the etching step are alternately performed more than once.

13. The method of claim 4, wherein the underlying film formation step and the etching step are alternately performed more than once.

14. The method of claim 5, wherein the underlying film formation step and the etching step are alternately performed more than once.

* * * * *